(12) United States Patent
Yang

(10) Patent No.: US 7,530,845 B1
(45) Date of Patent: May 12, 2009

(54) CONNECTOR EMI SHIELDING STRUCTURE

(75) Inventor: Haven Yang, Chung Ho (TW)

(73) Assignee: All Best Electronics Co., Ltd. (TW)

( * ) Notice: Subject to any disclaimer, the term of this patent is extended or adjusted under 35 U.S.C. 154(b) by 0 days.

(21) Appl. No.: 12/143,883

(22) Filed: Jun. 23, 2008

(51) Int. Cl.
*H01R 13/648* (2006.01)

(52) U.S. Cl. .................................................. 439/607

(58) Field of Classification Search ................. 439/607, 439/939, 95; 385/92
See application file for complete search history.

(56) References Cited

U.S. PATENT DOCUMENTS 6,478,622 B1 * 11/2002 Hwang ........................ 439/607
7,001,216 B1 * 2/2006 Huang ........................ 439/607

* cited by examiner

*Primary Examiner*—Tho D Ta
(74) *Attorney, Agent, or Firm*—Schmeiser, Olsen & Watts

(57) ABSTRACT

A connector EMI shielding structure includes an enclosure having a front open end and a rear end closed by a back plate, and being provided on two sidewalls with a bent hook each; and a shielding unit for fitting around the front open end of the enclosure. The shielding unit includes a top panel, two side panels, and two bottom panels. Each of the top panel, the side panels, and the bottom panels of the shielding unit is formed with an opening, from an inner edge of which one or more elastic leaves are extended rearward for elastically pressing against the enclosure. And, each of the side panels of the shielding unit is provided on a rear edge with a cut for engaging with the bent hooks on the sidewalls of the enclosure. With these arrangements, the shielding unit can be easily and firmly assembled to the enclosure.

4 Claims, 4 Drawing Sheets

A

CONNECTOR EMI SHIELDING STRUCTURE

FIELD OF THE INVENTION

The present invention relates to a connector electromagnetic interference (EMI) shielding structure, and more particularly to a connector EMI shielding structure that can be easily and firmly assembled for use.

BACKGROUND OF THE INVENTION

FIG. 1 shows a conventional connector electromagnetic interference (EMI) shielding structure. As shown, the conventional connector EMI shielding structure includes an enclosure 3 and three shielding elements 4 for mounting to an upper side and two lateral sides of an open end of the enclosure 3. Each of the shielding elements 4 includes a connecting section 41 and a plurality of elastic leaves 42 extended from two opposite sides of the connecting section 41. To assemble the shielding elements 4 to the enclosure 3, first connect the three shielding elements 4 at the connecting sections 41 to the upper, the left, and the right side of the open end of the enclosure 3, respectively; and then spot-weld the connecting sections 41 to the enclosure 3.

The open end of the enclosure 3 has a small size and each of connecting sections 41 has only a relatively small depth for engaging with the enclosure 3. Therefore, a high accuracy is required in spot-welding the connecting sections 41 to the enclosure 3 to avoid easy separation of the shielding elements 4 from the enclosure 3. Thus, the conventional connector EMI shielding structure requires a lot of complicated manufacturing procedures, prolonged manufacturing time, and increased labor to result in high manufacturing cost thereof.

SUMMARY OF THE INVENTION

It is therefore a primary object of the present invention to provide an improved connector EMI shielding structure that can be easily and firmly assembled for use to overcome the problems in the conventional connector EMI shielding structure.

To achieve the above and other objects, the connector EMI shielding structure according to the present invention includes an enclosure and a shielding unit. The enclosure has a front open end and a rear end closed by a back plate, and is provided on a top wall with at least two tongues, on two sidewalls with a bent hook each, and on a bottom wall with at least two retaining sections. The shielding unit is fitted around the front open end of the enclosure, and includes a top panel, two side panels perpendicularly downward extended from two lateral edges of the top panel, and two bottom panels horizontally extended from two lower edges of the two side panels toward each other. On each of the top panel, the side panels, and the bottom panels, there is formed an opening, from an inner edge of which one or more elastic leaves are extended rearward for elastically pressing against the enclosure. The top panel of the shielding unit is provided at predetermined positions with holes for engaging with the tongues on the top wall of the enclosure. Each of the two side panels of the shielding unit is formed on a rear edge with a cut for engaging with the bent hooks on the sidewalls of the enclosure. And, the openings on the bottom panels of the shielding unit are engaged with the retaining sections on the bottom wall of the enclosure.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1:
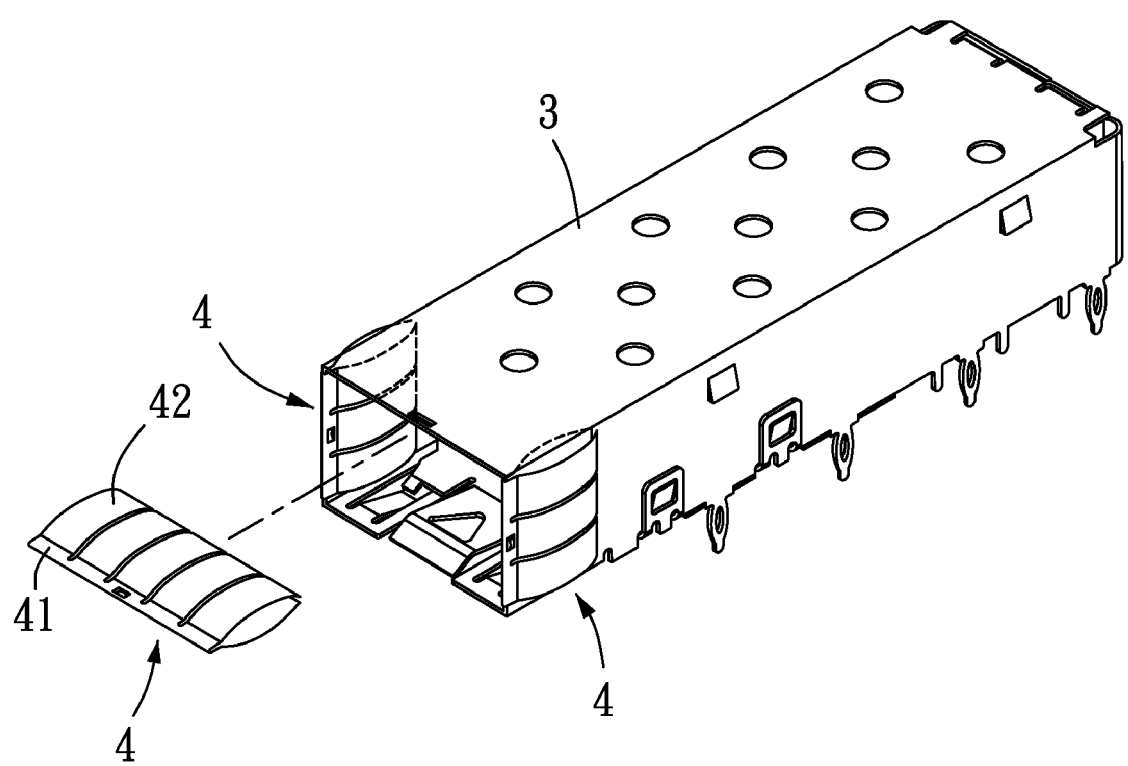
FIG. 1 is a partially exploded perspective view of a conventional connector EMI shielding structure.
Figure 2:
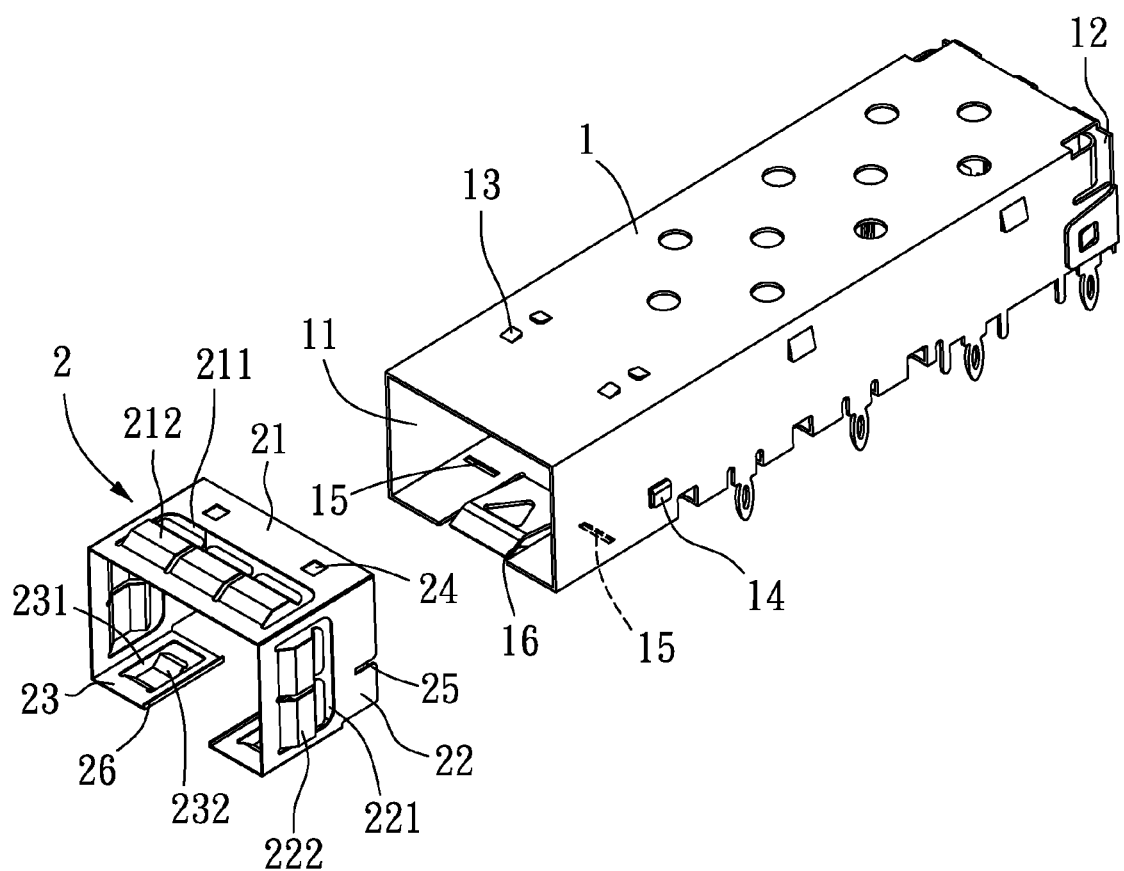
FIG. 2 is an exploded perspective view of a connector EMI shielding structure according to a preferred embodiment of the present invention.
Figure 3:
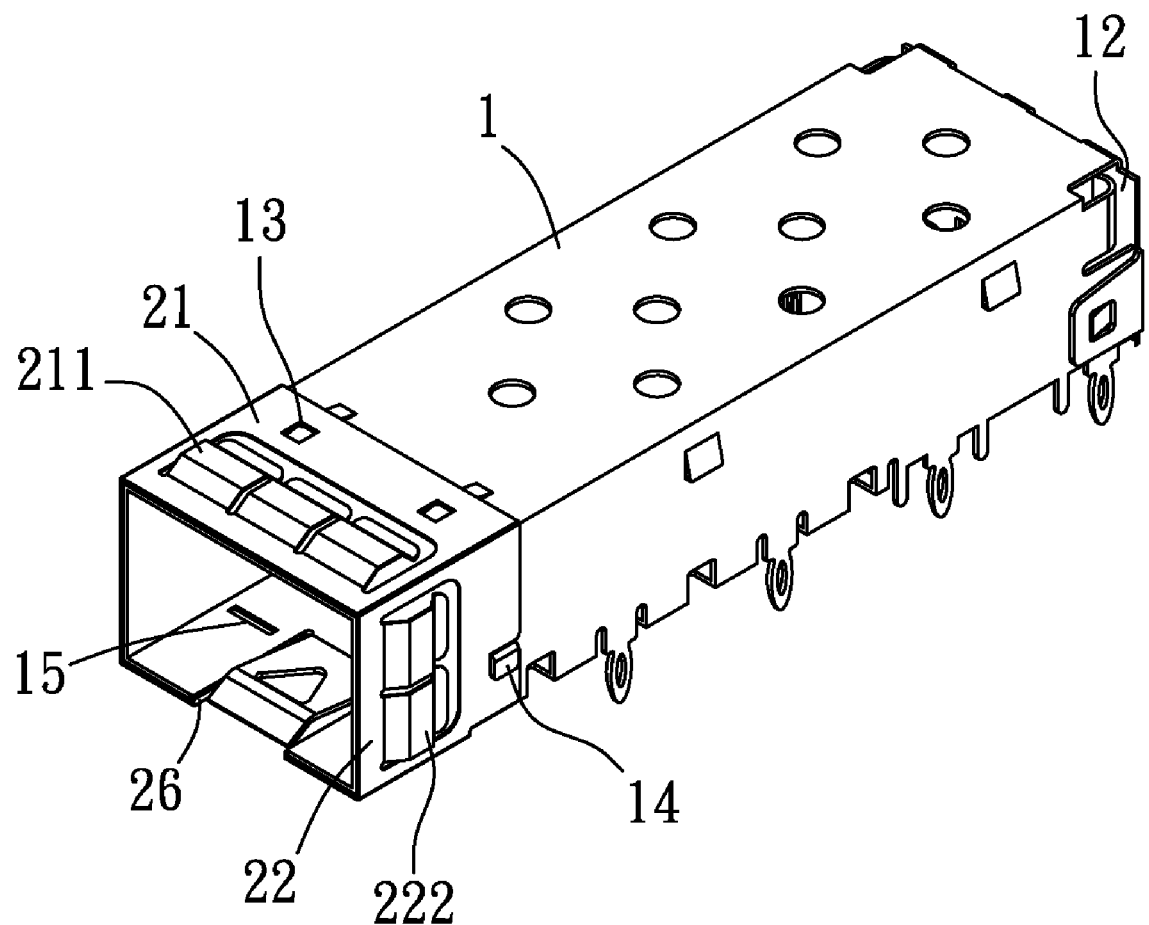
FIG. 3 is an assembled view of FIG. 2.
Figure 4:
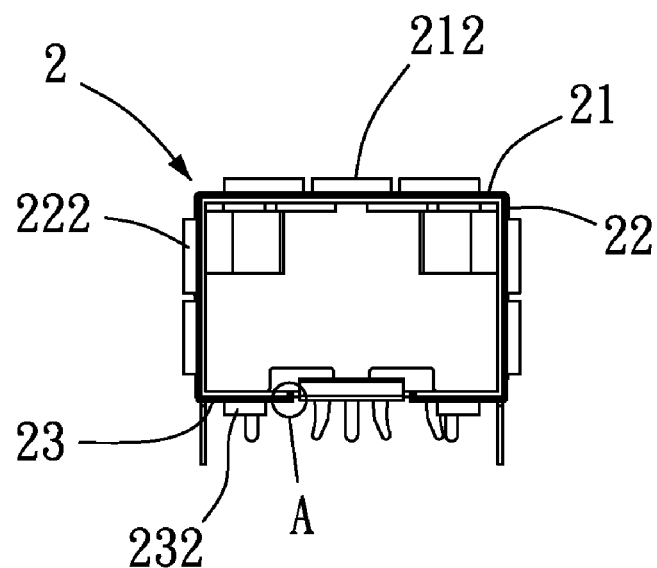
FIG. 4 is a front view of FIG. 3.
Figure 5:
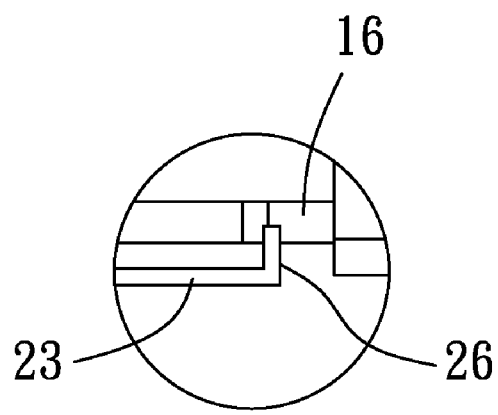
FIG. 5 is an enlarged view of the circled area A of FIG. 4.

Please refer to FIGS. 2 and 3 that are exploded and assembled perspective views, respectively, of a connector electromagnetic interference (EMI) shielding structure according to a preferred embodiment of the present invention. As shown, the connector EMI shielding structure of the present invention includes an enclosure 1 and a shielding unit 2.

The enclosure 1 has a front open end 11 and a rear end closed by a back plate 12, and is provided on a top wall with at least two tongues 13, on two sidewalls with a bent hook 14 each, on a bottom wall with at least two retaining sections 15, and on the bottom wall near the two retaining sections 15 with a slit 16 each.

The shielding unit 2 is fitted around the front open end 11 of the enclosure 1, and includes a top panel 21, two side panels 22 perpendicularly downward extended from two lateral edges of the top panel 21, and two bottom panels 23 horizontally extended from two lower edges of the two side panels 22 toward each other. On each of the top panel 21, the side panels 22, and the bottom panels 23, there is formed an opening 211, 221, 231, from an inner edge of which one or more elastic leaves 212, 222, 232 are extended rearward for elastically pressing against the enclosure 1. The top panel 21 is provided at predetermined positions with holes 24 for engaging with the tongues 13 on the top wall of the enclosure 1. Each of the two side panels 22 is formed on a rear edge with a cut 25 for engaging with the bent hooks 14 on the sidewalls of the enclosure 1. The openings 231 on the bottom panels 23 of the shielding unit 2 are engaged with the retaining sections 15 on the bottom wall of the enclosure 1. It is noted the two horizontally extended bottom panels 23 are provided along respective free edge with a raised stopper 26 for engaging with the two slits 16 on the bottom wall of the enclosure 1.

To assemble the connector EMI shielding structure of the present invention, simply align the shielding unit 2 with the front open end 11 of the enclosure 1 and then fit the shielding unit around the front open end 11 with a front end of the shielding unit 2 flush with front edges of the front open end 11 of the enclosure 1, so that the top panel 21, the side panels 22, and the bottom panels 23 of the shielding unit 2 respectively bear against the top wall, the sidewalls, and the bottom wall of the enclosure 1. With the shielding unit 2 in the above-described position, the holes 24 of the top panel 21 are engaged with the tongues 13 on the top wall of the enclosure 1, the cuts 25 on the side panels 22 are engaged with the bent hooks 14 on the sidewalls of the enclosure 1, and the openings 231 on the bottom panels 23 are engaged with the retaining sections 15 on the bottom wall of the enclosure 1 with the two stoppers 26 received in the two slits 16. Accordingly, the shielding unit 2 is firmly assembled to the enclosure 1.

With the above arrangements, the shielding unit 2 of the connector EMI shielding structure of the present invention can be easily and firmly assembled to the enclosure 1 without the need of welding to the enclosure or the risk of separating from the enclosure 1. Therefore, the connector EMI shielding structure of the present invention is improved, economical, and more practical for use.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A connector EMI shielding structure, comprising:
   an enclosure having a front open and a rear end closed by a back plate, and being provided on two sidewalls with a bent hook each; and
   a shielding unit being fitted around the front open end of the enclosure, and including a top panel, two side panels perpendicularly downward extended from two lateral edges of the top panel, and two bottom panels horizontally extended from two lower edges of the two side panels toward each other;
   wherein, on each of the top panel, the side panels, and the bottom panels of the shielding unit, there is formed an opening, from an inner edge of which one or more elastic leaves are extended rearward for elastically pressing against the enclosure; and each of the side panels of the shielding unit is provided on a rear edge with a cut for engaging with the bent hooks on the sidewalls of the enclosure.

2. The connector EMI shielding structure as claimed in claim 1, wherein the enclosure is provided on a top wall with at least two tongues, on a bottom wall with at least two retaining sections, and on the bottom wall near the two retaining sections with a slit each.

3. The connector EMI shielding structure as claimed in claim 1, wherein the bottom panels of the shielding unit are provided along respective free edge with a raised stopper.

4. The connector EMI shielding structure as claimed in claim 1, wherein the shielding unit is provided on the top panel with at least two holes.

* * * * *